(12) United States Patent
Lee et al.

(10) Patent No.: US 9,977,109 B2
(45) Date of Patent: May 22, 2018

(54) MAGNETIC RESONANCE IMAGING APPARATUS AND OPERATING METHOD FOR THE SAME

(71) Applicants: SAMSUNG ELECTRONICS CO., LTD., Suwon-si (KR); INDUSTRY-ACADEMIC COOPERATION FOUNDATION, YONSEI UNIVERSITY, Seoul (KR)

(72) Inventors: Young-woon Lee, Suwon-si (KR); Jin-seong Jang, Seoul (KR); Do-sik Hwang, Seoul (KR); Tae-joon Eo, Cheongju-si (KR); Hae-kyung Jung, Seongnam-si (KR); Dong-hyun Kim, Seoul (KR); Min-oh Kim, Seoul (KR); Na-rae Choi, Seogwipo-si (KR); Dong-yeob Han, Seoul (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 702 days.

(21) Appl. No.: 14/538,217

(22) Filed: Nov. 11, 2014

(65) Prior Publication Data
US 2015/0130461 A1    May 14, 2015

(30) Foreign Application Priority Data

Nov. 11, 2013 (KR) .................. 10-2013-0136383
Aug. 29, 2014 (KR) .................. 10-2014-0114514

(51) Int. Cl.
*G01R 33/56* (2006.01)
*G01R 33/561* (2006.01)

(52) U.S. Cl.
CPC .................. *G01R 33/5619* (2013.01)

(58) Field of Classification Search
CPC ............ G01R 33/5608; G01R 33/5611; G01R 33/4824; G01R 33/5619; G01R 33/246;
(Continued)

(56) References Cited

U.S. PATENT DOCUMENTS

2007/0242866 A1* 10/2007 Schmitt .............. G01R 33/4818
382/130
2008/0242972 A1* 10/2008 Jung .................. G01R 33/5611
600/410

(Continued)

FOREIGN PATENT DOCUMENTS

WO    2012/037067 A1    3/2012
WO    2013/116775 A1    8/2013

OTHER PUBLICATIONS

Dan Ma, et al., "Magnetic resonance fingerprinting", nature11971, Mar. 14, 2013, total 18 pages, vol. 495, Macmillan Publishers Limited.

(Continued)

*Primary Examiner* — Clayton E LaBalle
*Assistant Examiner* — Ruifeng Pu
(74) *Attorney, Agent, or Firm* — Sughrue Mion, PLLC (57) ABSTRACT

Provided is a magnetic resonance imaging (MRI) apparatus. The MRI apparatus includes: a storage configured to store a plurality of MR signal data sets generated by applying a plurality of values of a first MR parameter and a plurality of values of a second MR parameter to an MR signal data generation model; a data acquisition unit configured to acquire an MR signal data set for a specific position of an object by undersampling an MR signal, based on the values of the first MR parameter; and an image processor configured to extract an MR signal data set that matches the MR (Continued)

signal data set acquired by undersampling the MR signal (hereinafter referred to as the 'undersampled MR signal data set') from among the stored MR signal data sets, obtain a value of the second MR parameter for the undersampled MR signal data set based on the extracted MR signal data set, and interpolate unsampled MR signal data in the undersampled MR signal data set (hereinafter, referred to as the 'interpolated MR signal data set') by using the value of the second MR parameter.

11 Claims, 9 Drawing Sheets
(3 of 9 Drawing Sheet(s) Filed in Color)

(58) Field of Classification Search
CPC ..... G01R 33/561; A61B 5/055; A61B 5/4566; A61B 5/7289; A61B 5/14542; A61B 5/14507; A61B 5/5602
See application file for complete search history.

(56) References Cited

U.S. PATENT DOCUMENTS

| | | | |
|---|---|---|---|
| 2012/0229136 A1* | 9/2012 | Stemmer | G01R 33/5659 324/307 |
| 2015/0130461 A1* | 5/2015 | Lee | G01R 33/5619 324/309 |
| 2015/0323634 A1* | 11/2015 | Polimeni | G01R 33/56509 324/309 |
| 2016/0274209 A1* | 9/2016 | Dannels | G01R 33/4824 |

OTHER PUBLICATIONS

Mariya Doneva, et al., "Compressed Sensing Reconstruction for Magnetic Resonance Parameter Mapping", Magnetic Resonance in Medicine, Oct. 2010, pp. 1114-1120, 64.

Michael Lustig, et al., "Sparse MRI: The Application of Compressed Sensing for Rapid MR Imaging", Magnetic Resonance in Medicine, Dec. 2007, pp. 1182-1195, 58.

* cited by examiner

MAGNETIC RESONANCE IMAGING APPARATUS AND OPERATING METHOD FOR THE SAME

RELATED APPLICATIONS

This application claims the benefit of Korean Patent Application No. 10-2013-0136383, filed on Nov. 11, 2013, and Korean Patent Application No. 10-2014-0114514, filed on Aug. 29, 2014, in the Korean Intellectual Property Office, the disclosures of which are incorporated herein in their entireties by reference.

BACKGROUND

1. Field

One or more exemplary embodiments relate to a magnetic resonance imaging (MRI) apparatus and a method of operating the same, and more particularly, to an MRI apparatus adapted to generate accurate MR images based on undersampled data.

2. Description of the Related Art

Magnetic resonance imaging (MRI) creates images by using information determined through the resonance of atomic nuclei exposed to a magnetic field. The resonance of atomic nuclei is a phenomenon where an atomic nucleus in a low energy state absorbs RF energy and is excited to a higher energy state when a specific radio frequency (RF) is incident on the atomic nucleus magnetized by an external magnetic field. Atomic nuclei have different resonant frequencies depending on their types, and the resonance thereof is affected by the intensity of an external magnetic field. The human body includes a large number of atomic nuclei, and hydrogen nuclei are commonly used for MRI.

In many cases, it takes a long time to acquire MR images. Recently, research has been conducted on imaging techniques for obtaining MR images in a short time.

SUMMARY

One or more exemplary embodiments include a magnetic resonance imaging (MRI) apparatus adapted to generate accurate MR images based on undersampled data, and a method of operating the same.

Additional aspects will be set forth in part in the description which follows and, in part, will be apparent from the description, or may be learned by practice of the presented exemplary embodiments.

According to one or more exemplary embodiments, an MRI apparatus includes: a storage configured to store a plurality of MR signal data sets generated by applying a plurality of values of a first MR parameter and a plurality of values of a second MR parameter to an MR signal data generation model; a data acquisition unit configured to acquire an MR signal data set for a specific position of an object by undersampling an MR signal, based on the values of the first MR parameter; and an image processor configured to extract an MR signal data set that matches the MR signal data set acquired by undersampling the MR signal (hereinafter referred to as the 'undersampled MR signal data set') from among the stored MR signal data sets, obtain a value of the second MR parameter for the undersampled MR signal data set based on the extracted MR signal data set, and interpolate unsampled MR signal data in the undersampled MR signal data set (hereinafter, referred to as the 'interpolated MR signal data set') by using the value of the second MR parameter.

The image processor may generate an MR image by using the interpolated MR signal data set.

The first MR parameter may include at least one selected from Echo Time (TE), Repetition Time (TR), Inversion Time (TI), and Flip Angle (FA), and the second MR parameter may include at least one selected from M0, T1, T2, and ΔB.

The image processor may extract a second MR signal data set that matches the interpolated MR signal data set from among the stored MR signal data sets, obtain a second value of the second MR parameter for the interpolated MR signal data set, and interpolate unsampled MR signal data in the undersampled MR signal data set by using the second value of the second MR parameter.

The image processor may create a map of the second MR parameter by using the interpolated MR signal data set.

The image processor may create a magnetic field inhomogeneity map by using the interpolated MR signal data set, measure a difference between adjacent data in the magnetic field inhomogeneity map to extract a region where the measured difference is greater than or equal to a preset value, adjust a value of data so that the difference for the extracted region is less than the preset value, and interpolate the interpolated MR signal data set again based on the adjusted value of data.

According to one or more exemplary embodiments, a method of operating an MRI apparatus includes storing a plurality of MR signal data sets generated by applying a plurality of values of a first MR parameter and a plurality of values of a second MR parameter to an MR signal data generation model; acquiring an MR signal data set for a specific position of an object by undersampling an MR signal, based on the values of the first MR parameter; and extracting an MR signal data set that matches the MR signal data set acquired by undersampling the MR signal (hereinafter referred to as the 'undersampled MR signal data set') from among the stored MR signal data sets; obtaining a value of the second MR parameter for the undersampled MR signal data set based on the extracted MR signal data set; and interpolating unsampled MR signal data in the undersampled MR signal data set (hereinafter, referred to as the 'interpolated MR signal data set') by using the value of the second MR parameter.

The method may further include: extracting a second MR signal data set that matches the interpolated MR signal data set from among the stored MR signal data sets; obtaining a second value of the second MR parameter for the interpolated MR signal data set; and interpolating unsampled MR signal data in the undersampled MR signal data set by using the second value of the second MR parameter.

A map of the second MR parameter may be created by using the interpolated MR signal data set.

The method may further include: creating a magnetic field inhomogeneity map by using the interpolated MR signal data set; measuring a difference between adjacent data in the magnetic field inhomogeneity map to extract a region where the measured difference is greater than or equal to a preset value; adjusting data so that the difference for the extracted region is less than the preset value; and interpolating the interpolated MR signal data set again based on the adjusted data.

According to the exemplary embodiments, even when excessive undersampling is performed, it is possible to generate an MR image that is similar to that generated based on fully sampled data, and thus the accuracy of the MR image may be increased.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and/or other aspects will become apparent and more readily appreciated from the following description of the exemplary embodiments, taken in conjunction with the accompanying drawings in which.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. Expressions such as "at least one of," when preceding a list of elements, modify the entire list of elements and do not modify the individual elements of the list.

Advantages and features of one or more embodiments of the present inventive concept and methods of accomplishing the same may be understood more readily by reference to the following detailed description of the embodiments and the accompanying drawings. In this regard, the present embodiments may have different forms and should not be construed as being limited to the descriptions set forth herein. Rather, these embodiments are provided so that this disclosure will be thorough and complete and will fully convey the concept of the present embodiments to one of ordinary skill in the art, and the present inventive concept will only be defined by the appended claims.

Terms used herein will now be briefly described and then one or more embodiments of the present inventive concept will be described in detail.

All terms including descriptive or technical terms which are used herein should be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description of the invention. Thus, the terms used herein have to be defined based on the meaning of the terms together with the description throughout the specification.

When a part "includes" or "comprises" an element, unless there is a particular description contrary thereto, the part can further include other elements, not excluding the other elements. Also, the term "unit" in the embodiments of the present inventive concept means a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to embodiments, examples of which are illustrated in the accompanying drawings. In this regard, the present embodiments may have different forms and should not be construed as being limited to the descriptions set forth herein. In the following description, well-known functions or constructions are not described in detail so as not to obscure the embodiments with unnecessary detail.

In the present specification, an "image" may refer to multi-dimensional data composed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

An MRI apparatus is an apparatus for acquiring a sectional image of a part of an object by expressing, in a contrast comparison, a strength of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI apparatus may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI apparatuses include characteristics different from those of other imaging apparatuses. Unlike imaging apparatuses such as CT apparatuses that acquire images according to a direction of detection hardware, MRI apparatuses may acquire 2D images or 3D volume images that are oriented toward an optional point. MRI apparatuses do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

Figure 1:
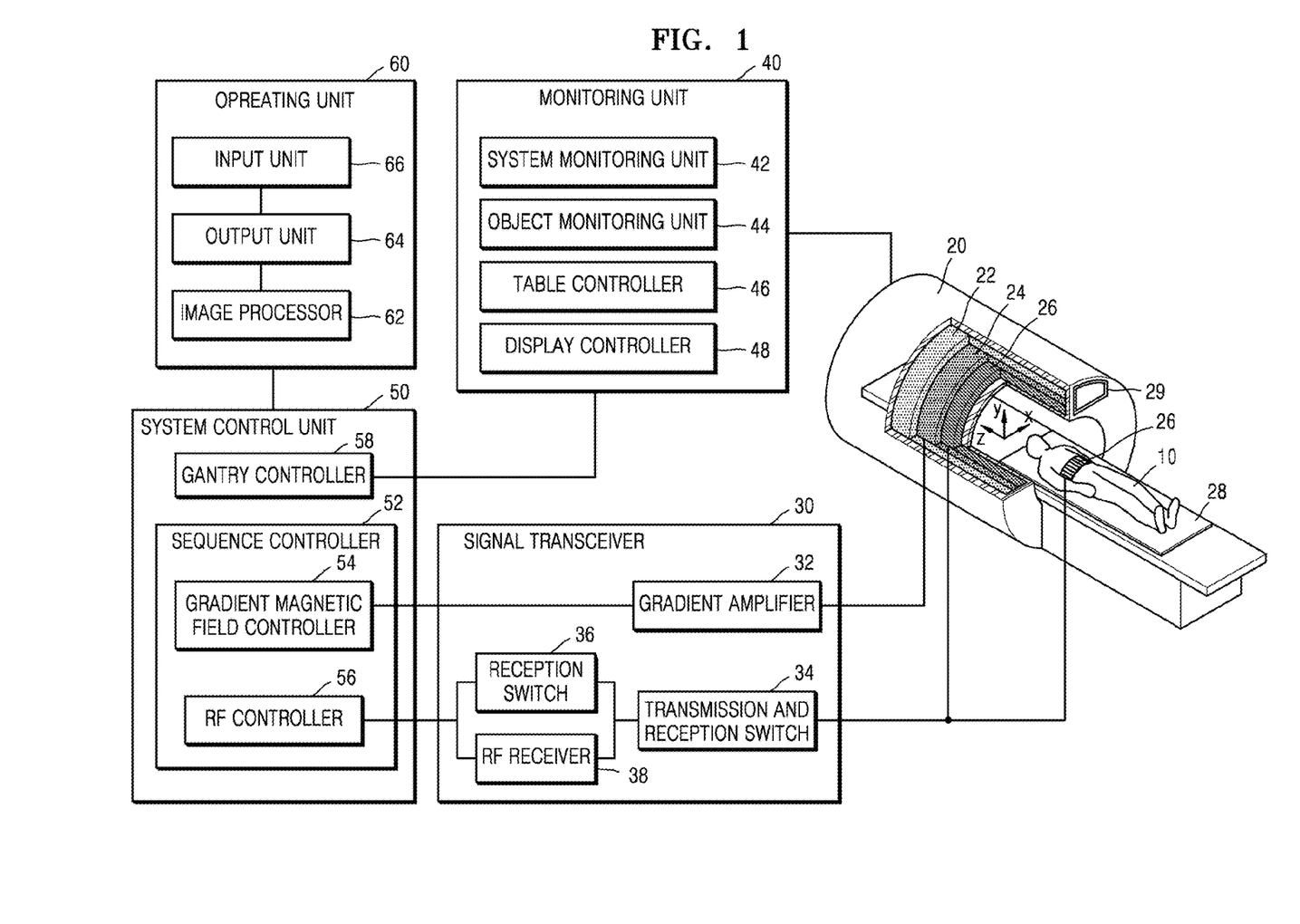
FIG. 1 is a block diagram of a general magnetic resonance imaging (MRI) apparatus.

FIG. 1 is a block diagram of a general MRI apparatus.

Referring to FIG. 1, the general MRI apparatus may include a gantry 20, a signal transceiver 30, a monitoring unit 40, a system control unit 50, and an operating unit 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform. However, if a strong main magnet is used, a magnetic field generated by the main magnet may often be non-uniform. The measured degree of inhomogeneity of a magnetic field is called a parameter $\Delta B$ (magnetic field inhomogeneity).

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may communicate with an external apparatus via wires and/or wirelessly, and may also perform dual tune communication according to a communication frequency band.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit 42, an object monitoring unit 44, a table controller 46, and a display controller 48.

The system monitoring unit 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. Here, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI system.

The operating unit 60 may include an image processor 62 for receiving and processing the MR signal received by the RF receiver 38, an output unit 64, and an input unit 66.

The image processor 62 may process the MR signal received from the RF receiver 38 so as to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a k space (for example, also referred to as a Fourier space or a frequency space) of a memory, and rearrange the digital data into image data via 2D or 3D Fourier transformation.

A k-space is a set of raw data for an MR signal, and may include position information and contrast information.

Digital data arranged in a k-space may be undersampled data, and thus data may not be arranged and missing in some rows of the k-space.

Furthermore, the image processor 62 may perform a composition process or a difference calculation process on image data if necessary. The composition process may include an addition process performed on a pixel, a maximum intensity projection (MIP) process, etc. The image processor 62 may store not only the rearranged image data but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 may output image data generated or rearranged by the image processor 62 to the user. The output unit 64 may also output information required for the user to manipulate the MRI system, such as a user interface (UI), user information, or object information. The output unit 64 may be a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input unit 66. The input unit 66 may be a keyboard, a mouse, a track ball, a voice recognizer, a gesture recognizer, a touch screen, or any one of other various input devices that are well known to one of ordinary skill in the art.

The signal transceiver 30, the monitoring unit 40, the system control unit 50, and the operating unit 60 are separate components in FIG. 1, but it will be obvious to one of ordinary skill in the art that respective functions of the signal transceiver 30, the monitoring unit 40, the system control unit 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI system may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

Figure 2:
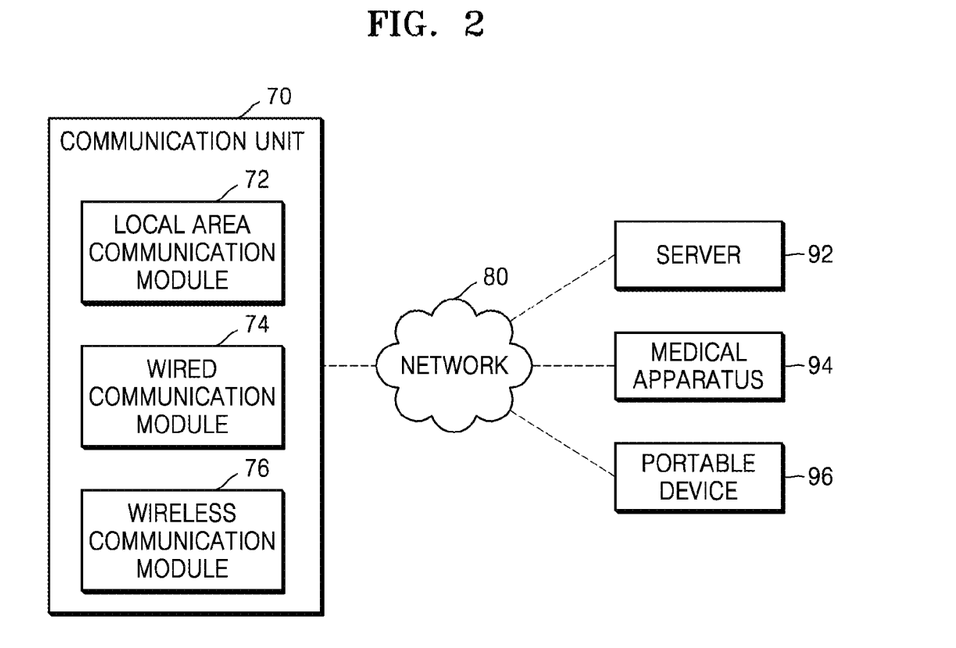
FIG. 2 illustrates a configuration of a communication unit in the MRI apparatus of FIG. 1.

FIG. 2 is a block diagram of a communication unit 70 according to an embodiment of the present inventive concept. Referring to FIG. 2, the communication unit 70 may be connected to at least one selected from the gantry 20, the signal transceiver 30, the monitoring unit 40, the system control unit 50, and the operating unit 60 of FIG. 1.

The communication unit 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 2, the communication unit 70 may be connected to a network 80 by wire or wirelessly to communicate with a server 92, a medical apparatus 94, or a portable device 96.

In detail, the communication unit 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communication unit 70 may receive a diagnosis history or a treatment schedule of the object from the server 92 and use the same to diagnose the object. The communication unit 70 may perform data communication not only with the server 92 or the medical apparatus 94 in a hospital, but also with the portable device 96, such as a mobile phone, a personal digital assistant (PDA), or a laptop of a doctor or patient.

Also, the communication unit 70 may transmit information about a malfunction of the MRI apparatus or about a medical image quality to a user through the network 80, and receive a feedback regarding the information from the user.

The communication unit 70 may include at least one component enabling communication with an external apparatus.

For example, the communication unit 70 may include a local area communication module 72, a wired communication module 74, and a wireless communication module 76. The local area communication module 72 refers to a module for performing local area communication with an apparatus within a predetermined distance. Examples of local area communication technology according to an embodiment of the present inventive concept include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication module 74 refers to a module for performing communication by using an electric signal or an optical signal. Examples of wired communication technology according to an embodiment of the present inventive concept include wired communication techniques using a pair cable, a coaxial cable, and an optical fiber cable, and other well-known wired communication techniques.

The wireless communication module 76 transmits and receives a wireless signal to and from at least one selected from a base station, an external apparatus, and a server in a mobile communication network. Here, the wireless signal may be a voice call signal, a video call signal, or data in any one of various formats according to transmission and reception of a text/multimedia message.

Figure 3:
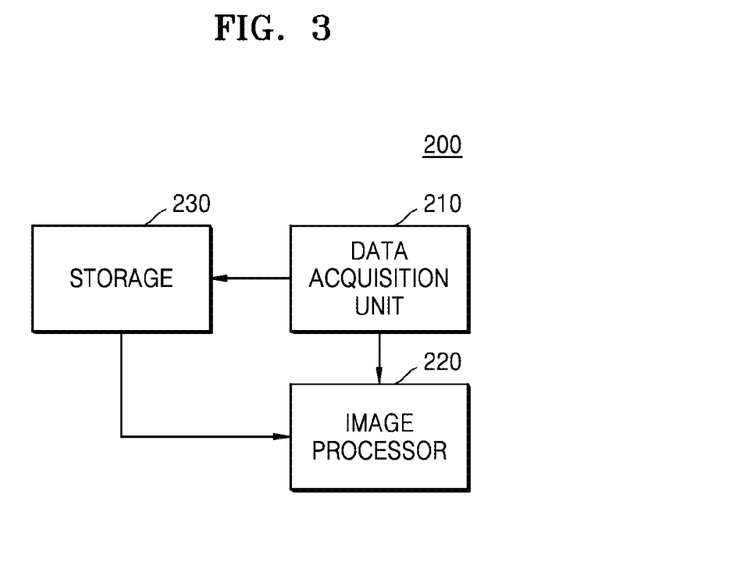
FIG. 3 is a block diagram of an MRI apparatus according to an exemplary embodiment.

FIG. 3 is a block diagram of an MRI apparatus 200 according to an exemplary embodiment.

Referring to FIG. 3, the MRI apparatus according to the present exemplary embodiment may include a data acquisition unit 210, an image processor 220, and a storage 230.

The data acquisition unit 210 may correspond to the RF receiver 38 or operating unit 60 shown in FIG. 1, and the image processor 220 may correspond to the image processor 62 shown in FIG. 1.

The data acquisition unit 210 may generate a plurality of MR signal data sets by applying a plurality values of a first MR parameter and a plurality values of a second MR parameter to an MR signal data generation model, and store the plurality of MR signal data sets in the storage 230.

The data acquisition unit 210 may acquire an MR signal data set for a specific position of an object by undersampling an MR signal (hereinafter, referred to as the 'undersampled MR signal data set', based on a plurality values of first MR parameter.

The image processor 220 may extract an MR signal data set that matches undersampled MR signal data set from among a plurality of MR signal data sets stored in the storage 230 and obtain a value of the second MR parameter for the undersampled MR signal data set based on the extracted MR signal data set.

The image processor 220 may interpolate k-space data corresponding to an unsampled MR signal based on the obtained value of the second MR parameter. For example, the image processor 220 may generate unsampled MR signal data by using the value of the second MR parameter and an MR signal data generation model and interpolate data in an empty line of an undersampled k-space based on the unsampled MR signal data.

The image processor 220 may also perform Fourier transformation on the interpolated k-space data to generate an MR image.

Figure 4:
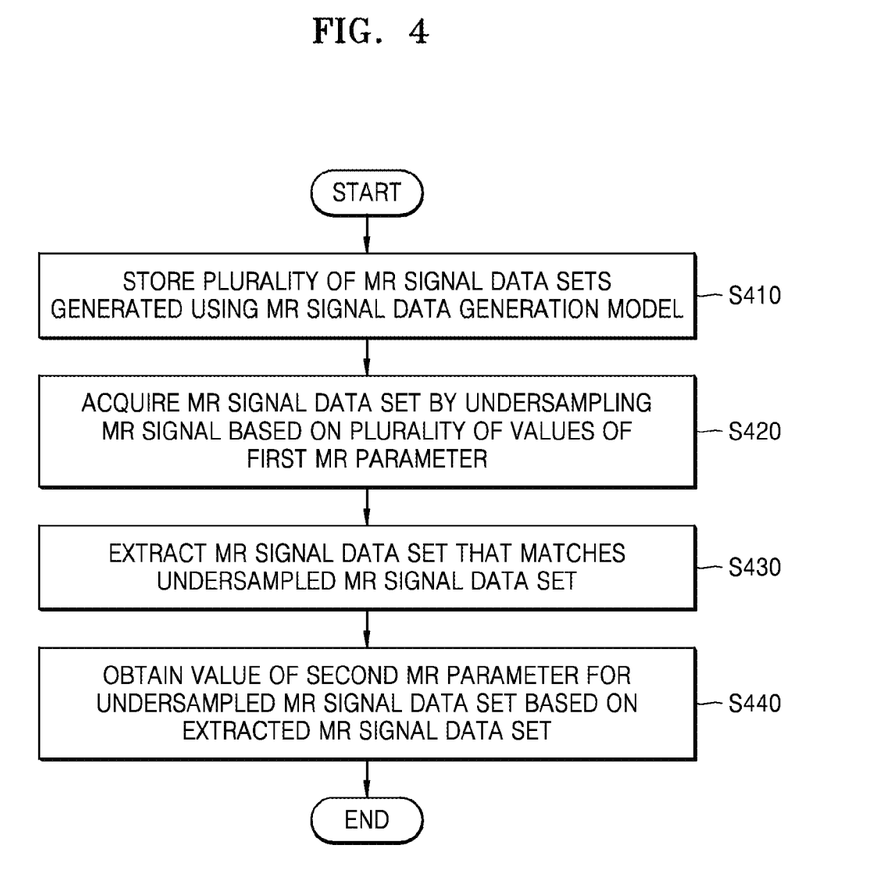
FIG. 4 is a flowchart of a method of operating an MRI apparatus according to an exemplary embodiment.

FIG. 4 is a flowchart of a method of operating an MRI apparatus according to an exemplary embodiment.

Referring to FIG. 4, the MRI apparatus (100 of FIG. 1 or 200 of FIG. 3) may generate a plurality of MR signal data sets by using an MR signal data generation model and store the MR signal data sets (S410).

The MRI apparatus 100 or 200 may generate the MR signal data sets by applying a plurality of values of a first MR parameter and a plurality of values of a second MR parameter to the MR signal data generation model. For example, the MR signal data generation model may be defined by Equation (1) below, and MR signal data may be calculated by substituting values of the first and second MR parameters into Equation (1), but exemplary embodiments are not limited thereto.

$$S(TE,TR,TI)=M0(1-2e^{\wedge}(-TI/T1)+e^{\wedge}(-TR/T1))*e^{\wedge}(-TE/T2)*\sin(FA*\Delta B) \quad (1)$$

where S denotes an MR signal, TE is the time between 90° pulse and echo signal for a spin echo sequence, i.e., the time it takes to emit energy absorbed by tissue, TR is the time interval between two consecutive 90° RF pulses that are used for obtaining first and next echo signals (MR signals), and Inversion Time (TI) is the time interval between the 180° pulse and the 90° pulse for an inversion recovery (IR) pulse sequence.

A flip angle (FA) FA may be influenced by adjustment factors and various properties such as an RF coil and an RF pulse shape and may change the contrast of an image.

The first MR parameter may include the TE, TR, TI, and FA, but are not limited thereto.

Furthermore, M0 represents a proton density, T1 is the time taken to restore approximately 63% of the longitudinal magnetization, T2 is the time taken for the transverse magnetization to decay to 37% of its initial value, and ΔB denotes a magnetic field inhomogeneity.

Values of the M0, T1, T2, and ΔB may vary according to properties of tissue. The second MR parameter may include the M0, T1, T2, and ΔB, but are not limited thereto.

Furthermore, each MR signal data set may include a plurality of MR signal data calculated by applying different values of the first MR parameter while a value of the second MR parameter remains unchanged. Alternatively, each MR signal data set may include a plurality of MR signal data calculated by applying different values of the second MR parameter while a value of the first MR parameter remains changed.

It is hereinafter assumed that one MR signal data set includes a plurality of MR signal data calculated by varying values of a first MR parameter while a value of a second MR parameter remains unchanged.

Furthermore, the MRI apparatus 100 or 200 may generate a plurality of MR signal data set by varying values of the second MR parameter.

For example, if the number of combinations of the first MR parameter is 100 and the number of combinations of the second MR parameter is 50, the MRI apparatus 100 or 200 may generate 50 MR signal data sets, each set including 100 MR signal data. However, exemplary embodiments are not limited thereto.

The MRI apparatus 100 or 200 may store the generated MR signal data sets in a database DB.

In addition, the MRI apparatus 100 or 200 may generate an MR signal data set for a specific position of an object by undersampling an MR signal, based on a plurality values of a first MR parameter (S420).

For example, the MRI apparatus 100 or 200 may undersample an MR signal for an object based on a first value of a first MR parameter and an MR signal for the object based on a second value of the first MR parameter Furthermore, the MRI apparatus 100 or 200 may acquire an MR signal data set for a specific position of the object by using undersampled data. In this case, the MR signal data set for the specific position may include a plurality of MR signal data obtained by applying different values of a first MR parameter for the specific position.

For example, an MR signal data set for a first position of the object may include first MR signal data acquired by applying a first value of a first MR parameter and second MR signal data acquired by applying a second value of the first MR parameter.

However, if an MR signal is not sampled for the first position of the object during undersampling thereof based on the second value of the first MR parameter, the MR signal data set for the first position may not include the second MR signal data.

Furthermore, the MRI apparatus 100 or 200 may create a plurality of k-spaces in which undersampled MR signal data are arranged, each k-space including an missing line in which data is not arranged.

Referring back to FIG. 4, the MRI apparatus 100 or 200 may extract an MR signal data set that matches the undersampled MR signal data set from among the plurality of MR signal data sets stored in the storage (230 in FIG. 3) (S430).

For example, the MRI apparatus 100 or 200 may compare a pattern of the undersampled MR signal data set with a pattern of each of the plurality of MR signal data sets and extract an MR signal data set having the most similar pattern to the pattern of the undersampled MR signal data set.

The MRI apparatus 100 or 200 may obtain a value of a second MR parameter for the undersampled MR signal data set based on the extracted MR signal data set (S440).

For example, the MRI apparatus 100 or 200 may use a value of the second MR parameter corresponding to the extracted MR signal data set as the value of the second MR parameter for the undersampled MR signal data set.

In this case, the obtained value of the second MR parameter is a value of the second MR parameter for a specific position of the object, and a fully sampled second MR parameter map may be created for the object based on values of the second MR parameter for specific positions of the object.

In addition, the MRI apparatus 100 or 200 may interpolate unsampled MR signal data based on the obtained value of the second MR parameter (S450).

For example, the MRI apparatus 100 or 200 may generate unsampled MR signal data by using the value of the obtained second MR parameter and the MR signal generation model described in operation S410, and interpolate data in a missing line of a k-space that is acquired via undersampling in operation S420 based on the unsampled MR signal data.

Furthermore, the MRI apparatus 100 or 200 may perform Fourier transformation on the interpolated k-space data to generate an MR image, but is not limited thereto.

Figure 5:
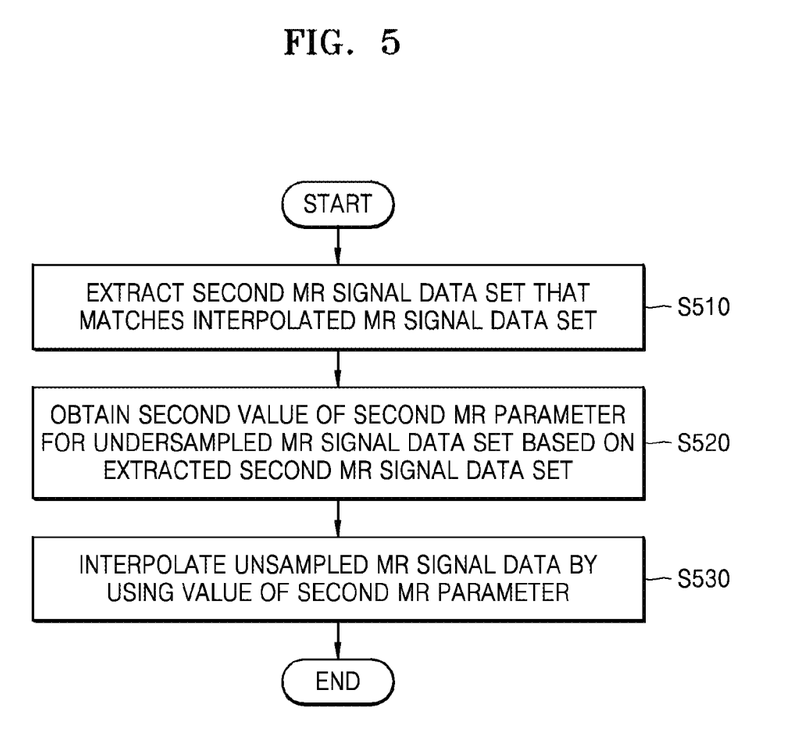
FIG. 5 is a flowchart of a method of operating an MRI apparatus according to an exemplary embodiment.

FIG. 5 is a flowchart of a method of operating the MRI apparatus 100 of FIG. 1 or 200 of FIG. 3) according to an exemplary embodiment.

Referring to FIG. 5, the MRI apparatus 100 or 200 may extract an MR signal data set that matches an MR signal data set interpolated in operation S450 of FIG. 4 from among the plurality of MR signal data sets stored in the storage (230 in FIG. 3) (S510).

For example, the MRI apparatus 100 or 200 may compare a pattern of the MR signal data set interpolated in operation S450 with a pattern of each of the plurality of MR signal data sets and extract an MR signal data set having the most similar pattern to the pattern of the interpolated MR signal pattern.

The MRI apparatus 100 or 200 may obtain a value of a second MR parameter for undersampled MR signal data set repeatedly based on the extracted MR signal data set (S520).

For example, the MRI apparatus 100 or 200 may use a value of the second MR parameter corresponding to the extracted MR signal data set as the value of the second MR parameter for the undersampled MR signal data set.

The value of the second MR parameter obtained in operation S520 may be different from the value of the second MR parameter obtained in operation S440.

The MRI apparatus 100 or 200 may interpolate unsampled MR signal data in the MR signal data set interpolated in operation S450, or previously interpolated data, based on the obtained value of the second MR parameter (S530).

For example, the MRI apparatus 100 or 200 may interpolate unsampled MR signal data by using the obtained value of the second MR parameter and the MR signal generation model described in operation S410 of FIG. 4. The MRI apparatus 100 or 200 may also interpolate data in a missing line of a k-space acquired via undersampling in operation S420 of FIG. 4, based on the interpolated MR signal data.

Furthermore, the MRI apparatus 100 or 200 may perform Fourier transformation on the interpolated k-space data to generate an MR image, but is not limited thereto.

Figure 6:
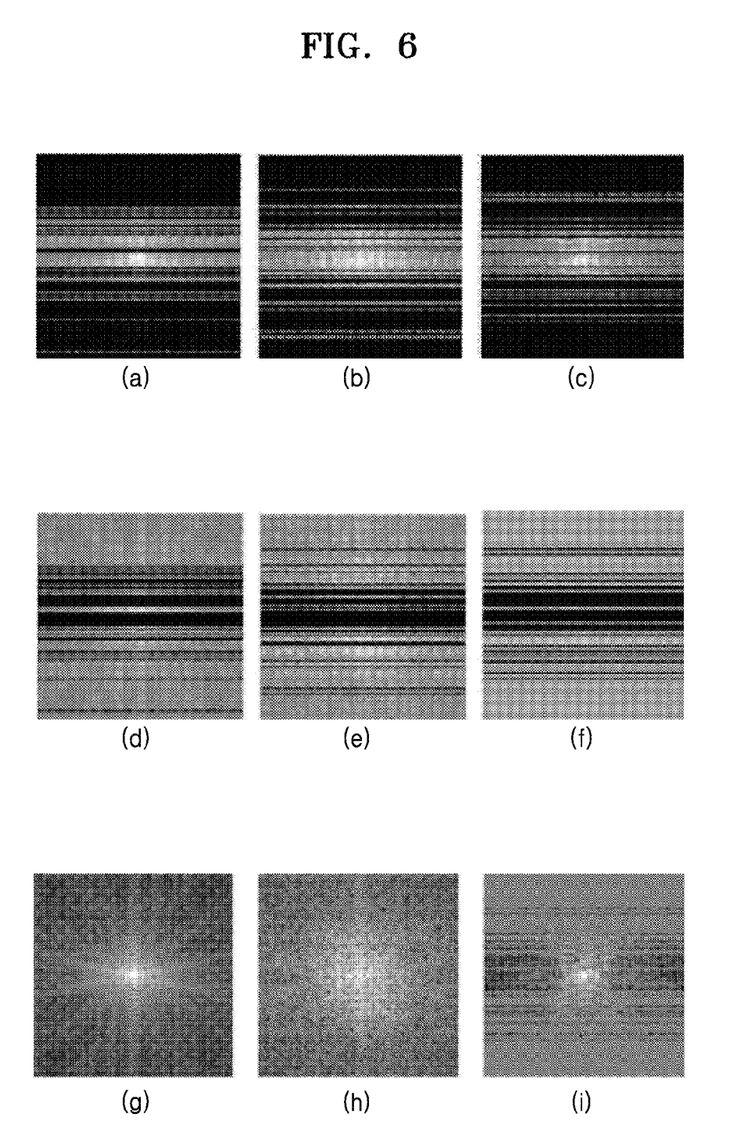
FIGS. 6 and 7 are diagrams for explaining a method of operating an MRI apparatus according to an exemplary embodiments.
Figure 7:
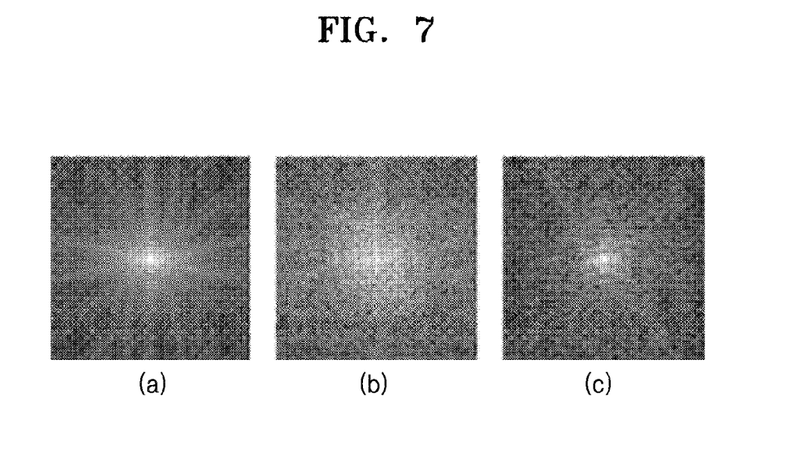

FIGS. 6 and 7 are diagrams for explaining a method of operating an MRI apparatus according to an exemplary embodiments;

FIGS. 6A through 6C illustrate k-spaces acquired via undersampling by the MRI apparatus 100 or 200, i.e., first through third k-spaces, respectively.

The first through third k-spaces are k-spaces in which MR signal data acquired for the same portion of an object at different time points are arranged. In other words, the first through third k-spaces are k-spaces in which MR signal data acquired by varying values of a first MR parameter for the same portion of the object are arranged.

FIGS. 6D through 6F correspond to FIGS. 6A through 6C, respectively, and illustrate data interpolated in operation S450 of FIG. 4.

FIG. 6G illustrates data obtained by combining data in the undersampled first k-space of FIG. 6A with the interpolated data of FIG. 6D, and FIG. 6H illustrates data obtained by combining data in the undersampled second k-space of FIG. 6B with the interpolated data of FIG. 6E. FIG. 6I illustrates data obtained by combining data in the undersampled third k-space of FIG. 6C with the interpolated data of FIG. 6F.

FIGS. 7A through 7C correspond to FIGS. 6G through 6I, respectively, and illustrate k-space data that is filled with data interpolated in operation S530 of FIG. 5.

In detail, the MRI apparatus 100 or 200 may compare data interpolated in operation S450 of FIG. 4 again with MR signal data sets stored in the storage 230 to match an MR signal data set to the interpolated data. The MRI apparatus 100 or 200 may then obtain a value of a second MR parameter based on the matched MR signal data set and fill a missing line in a k-space with a more accurate value than in operation S450 of FIG. 4 based on the obtained value of the second MR parameter.

Furthermore, the data illustrated in FIGS. 6G through 6I exhibit small deformations or small distortions compared to the data illustrated in FIGS. 7A through 7C.

Figure 8:
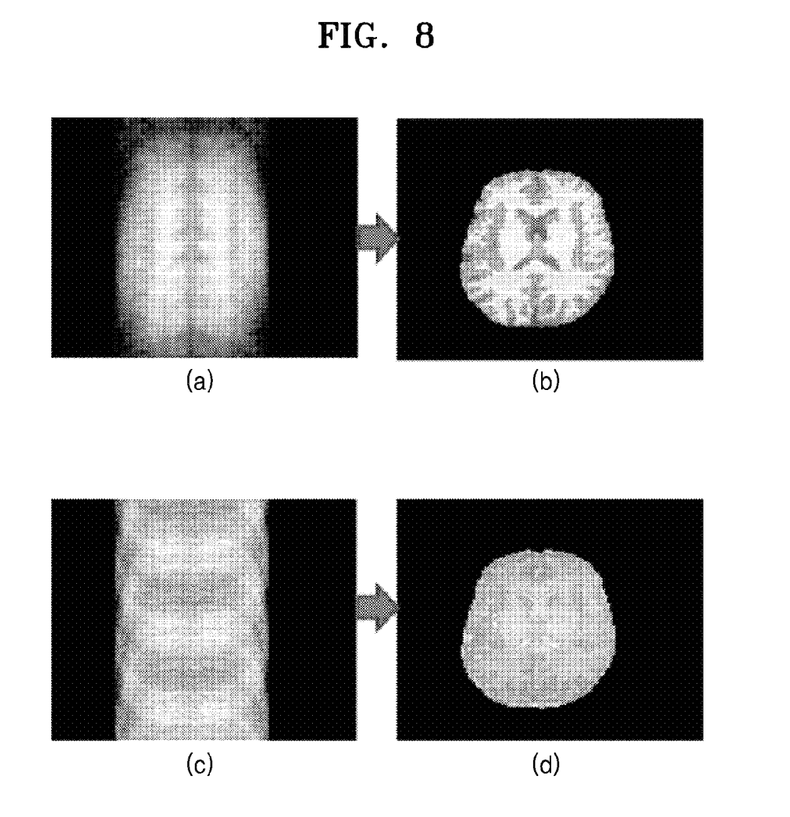
FIGS. 8 through 10 are diagrams illustrating MR images generated using an interpolation method according to exemplary embodiments.

FIGS. 8A and 8C illustrate MR images generated based on undersampled data, FIG. 8B illustrates an MR image generated by interpolating the undersampled data corresponding to the MR image of FIG. 8A according to the method of FIG. 5, and FIG. 8D illustrates an MR image generated by interpolating the undersampled data corresponding to the MR image of FIG. 8C according to the method of FIG. 5.

In this case, the MR images shown in FIGS. 8B and 8D may be generated by repeating operations S510, S520, and S530 of FIG. 5 many times.

FIGS. 9A through 9D illustrate MR images generated based on fully sampled k-space data, i.e., an enhanced M0 image, an enhanced T1 image, an enhanced T2 image, and an enhanced ΔB (magnetic field inhomogeneity) image, respectively. FIGS. 9E through 9H correspond to FIGS. 9A through 9D, respectively, and illustrate MR images generated based on data interpolated using the method of FIG. 4.

Figure 9:
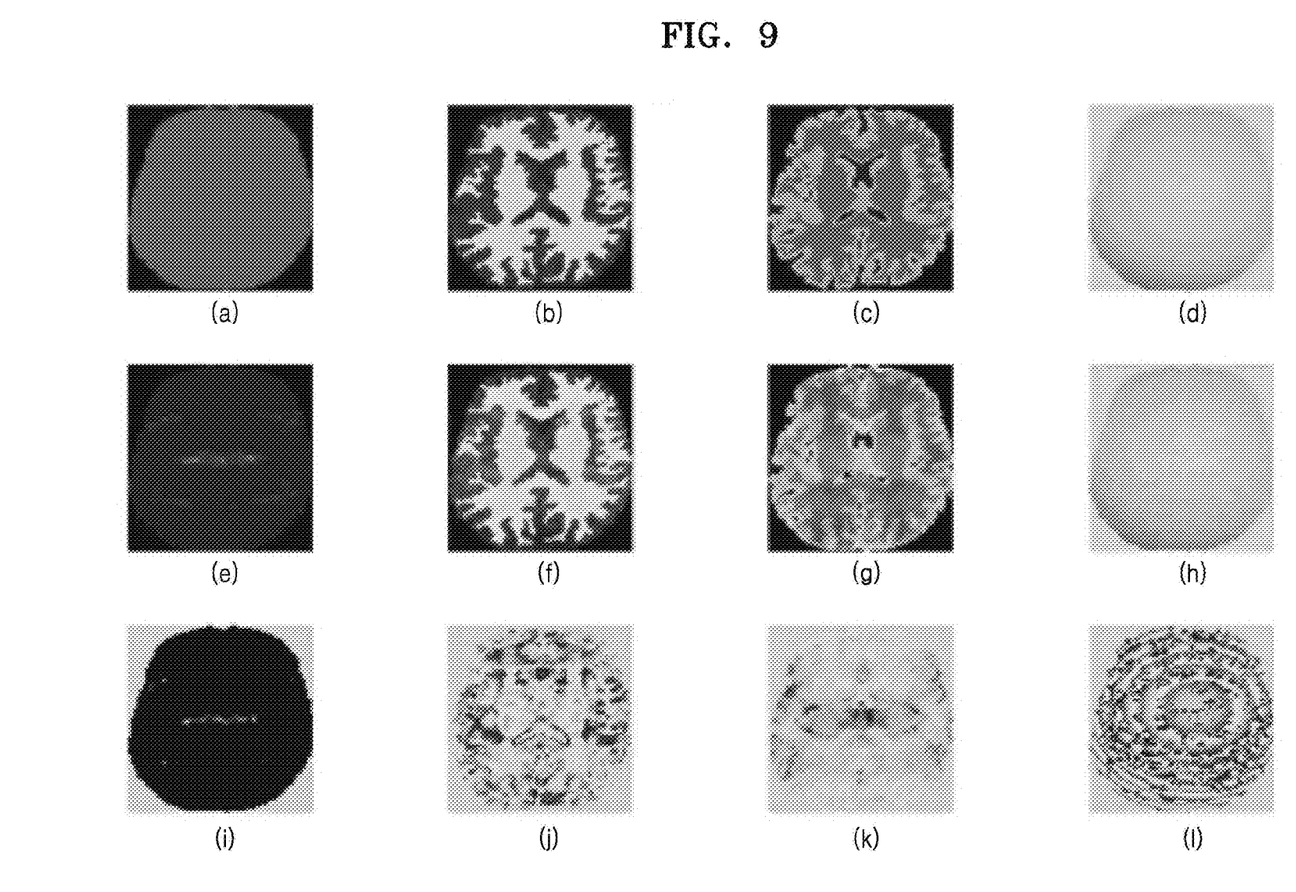

FIGS. 9I through 9L illustrate differential images between the MR images shown in FIGS. 9A and 9E, between the MR images shown in FIGS. 9B and 9F, between the MR images shown in FIGS. 9C and 9G, and between the MR images shown in FIGS. 9D and 9H, respectively.

FIGS. 10A through 10D illustrate MR images generated based on fully sampled k-space data, i.e., an enhanced M0 image, an enhanced T1 image, an enhanced T2 image, and an enhanced ΔB (magnetic field inhomogeneity) image, respectively. FIGS. 10E through 10H correspond to FIGS. 10A through 10D, respectively, and illustrate MR images generated based on data interpolated using the method of FIG. 5. The MR images shown in FIGS. 10E through 10H may be generated by repeating operations S510, S520, and S530 of FIG. 5 many times.

Figure 10:
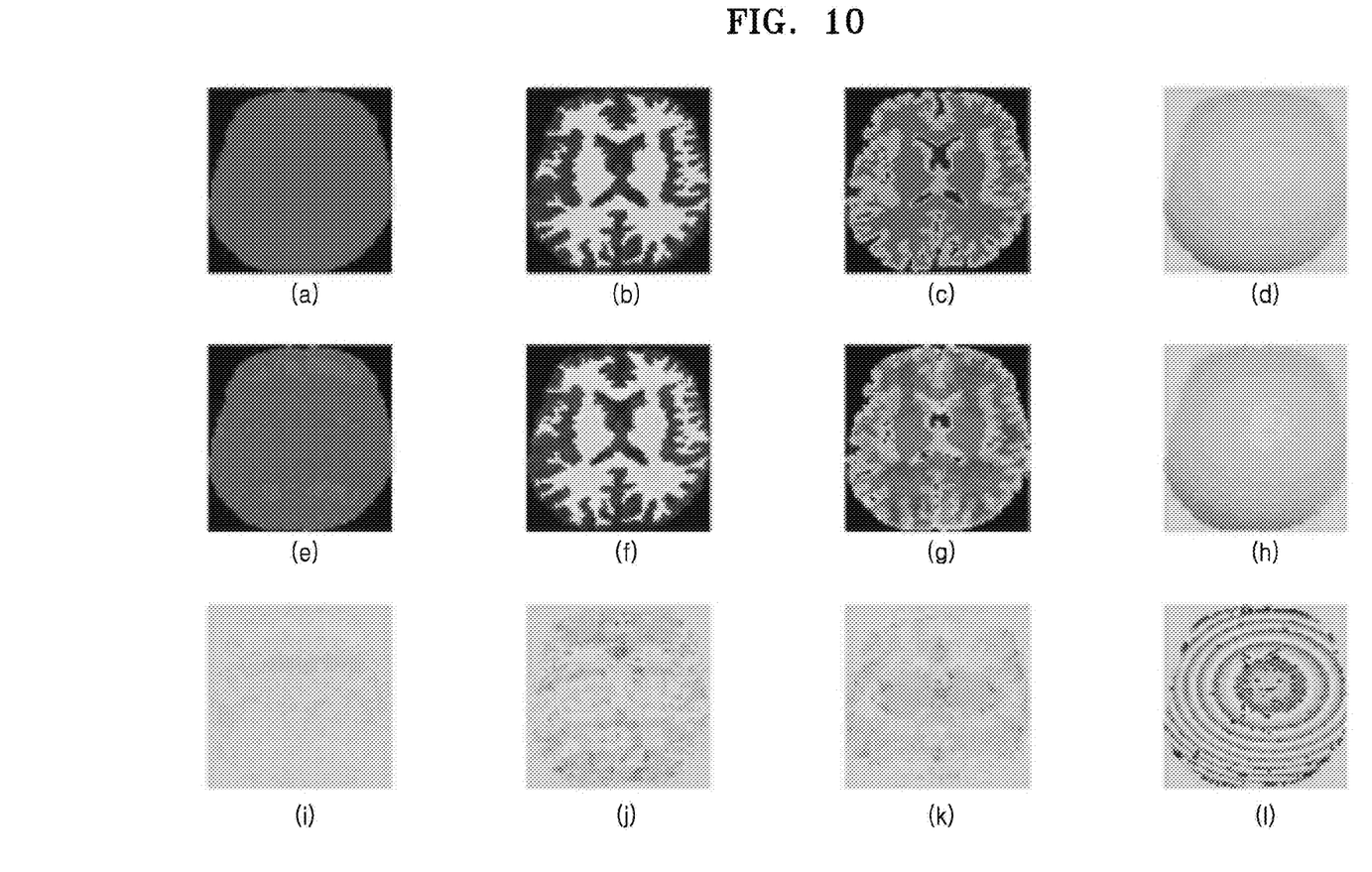

Furthermore, FIGS. 10I through 10L illustrate differential images between the MR images shown in FIGS. 10A and 10E, between the MR images shown in FIGS. 10B and 10F, between the MR images shown in FIGS. 10C and 10G, and between FIGS. 10D and 10H, respectively.

As evident from FIGS. 9I through 9L and 10I through 10L, the MR images of FIGS. 10I through 10L generated by repeatedly interpolating interpolated data (as in the method of FIG. 5) are more similar to MR images generated based on fully sampled k-space data than the MR images of FIGS. 9I through 9L generated by interpolating undersampled k-space data once (as in the method of FIG. 4).

Figure 11:
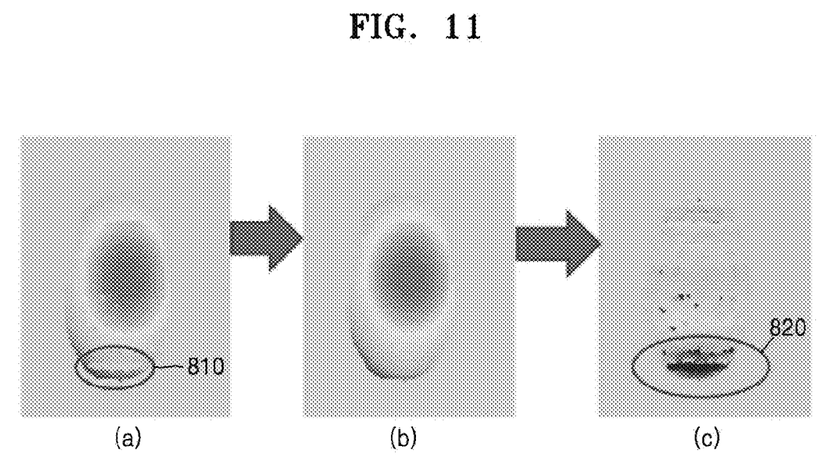
FIGS. 11A through 11C are a diagram for explaining a method of operating an MRI apparatus according to an exemplary embodiment.

FIGS. 11A through 11C are a diagram for explaining a data interpolation method according to an exemplary embodiment.

FIG. 11A illustrates a ΔB image generated based on interpolated data.

Referring to FIG. 11A, if a data interpolation method is performed, an error region 810 may occur in the ΔB image. Since the ΔB image show little change (e.g., little change in values of pixels that construct the image), a region subject to much change may be the error region 810. By using this property of the error region 810, the error region 810 may be removed by performing fitting with a specific 2D function (e.g., a 2D polynomial).

FIG. 11B illustrates a ΔB image from without the error region 810. For example, the MRI apparatus (100 of FIG. 1 or 200 of FIG. 3) may remove the error region 810 by adjusting data for the ΔB image so that a difference between adjacent data (pixel values) in the ΔB image is less than a threshold.

Furthermore, the MRI apparatus 100 or 200 may generate a differential image between the ΔB images of FIGS. 11A and 11B before and after performing fitting, respectively, and perform data interpolation again on a region 820 in the differential image where a data value (a pixel value) is greater than or equal to the threshold.

In detail, the MRI apparatus 100 or 200 may obtain a value of a second MR parameter by comparing an MR signal data set corresponding to the region 820 in the differential image where a data value (pixel value) is greater than or equal to the threshold with an MR signal data set stored in a database and perform data interpolation again on the region 820 based on the obtained value of the second MR parameter.

Thus, even when excessive undersampling is performed, an MR image generated using the data interpolation method according to the present embodiment may be similar to an MR image generated based on fully sampled data, and thus the accuracy of an MR image may be increased.

The methods of operating an MRI apparatus according to the exemplary embodiments may be embodied as a computer-readable code on a computer-readable storage medium in the MRI apparatus. The computer-readable storage medium is any data storage device that can store data which can be thereafter read by a processor. Examples of computer-readable storage media include read-only memory (ROM), random-access memory (RAM), CD-ROMs, magnetic tapes, floppy disks, optical data storage devices, etc. The computer-readable storage media can also be distributed over network coupled computer systems so that computer-readable codes are stored and executed in a distributed fashion.

While one or more exemplary embodiments have been described with reference to the figures, it will be understood by one of ordinary skill in the art that various changes in form and details may be made therein without departing from the spirit and scope of the present inventive concept as defined by the following claims. That is, all changes and modifications within the scope of the appended claims and their equivalents will be construed as being included in the present inventive concept.

What is claimed is:

1. A magnetic resonance imaging (MRI) apparatus comprising:
 a storage configured to store a plurality of MR signal data sets generated by applying a plurality of values of a first MR parameter and a plurality of values of a second MR parameter to an MR signal data generation model;
 a data acquisition unit configured to acquire an undersampled MR signal data set for a specific position of an object by undersampling an MR signal, based on the plurality of values of the first MR parameter; and
 an image processor configured to extract a first MR signal data set that matches the undersampled MR signal data set from among the stored MR signal data sets, obtain a value of the second MR parameter for the undersampled MR signal data set based on the extracted first MR signal data set, and generate an interpolated MR signal data set by interpolating unsampled MR signal data in the undersampled MR signal data set by using the value of the second MR parameter,
 wherein the image processor extracts a second MR signal data set that matches the interpolated MR signal data set from among the stored MR signal data sets, obtains a second value of the second MR parameter for the interpolated MR signal data set based on the extracted second MR signal data set, and interpolates unsampled MR signal data in the interpolated MR signal data set by using the second value of the second MR parameter.

2. The MRI apparatus of claim 1, wherein the image processor generates an MR image by using the interpolated MR signal data set.

3. The MRI apparatus of claim 1, wherein the first MR parameter comprises at least one selected from Echo Time (TE), Repetition Time (TR), Inversion Time (TI), and Flip Angle (FA), and
 wherein the second MR parameter comprises at least one selected from M0, T1, T2, and ΔB.

4. The MRI apparatus of claim 1, wherein the image processor creates a map of the second MR parameter by using the interpolated MR signal data set.

5. The MRI apparatus of claim 1, wherein the image processor creates a magnetic field inhomogeneity map by using the interpolated MR signal data set, measures a difference between adjacent data in the magnetic field inhomogeneity map to extract a region where the measured difference is greater than or equal to a preset value, adjusts a value of data so that the difference for the extracted region is less than the preset value, and interpolates the interpolated MR signal data set again based on the adjusted value of data.

6. A method of operating a magnetic resonance imaging (MRI) apparatus, the method comprising:
 storing a plurality of MR signal data sets generated by applying a plurality of values of a first MR parameter and a plurality of values of a second MR parameter to an MR signal data generation model;
 acquiring an undersampled MR signal data set for a specific position of an object by undersampling an MR signal, based on the plurality of values of the first MR parameter; and
 extracting a first MR signal data set that matches the undersampled MR signal data set from among the stored MR signal data sets;
 obtaining a value of the second MR parameter for the undersampled MR signal data set based on the extracted first MR signal data set; and
 generating an interpolated MR signal data set by interpolating unsampled MR signal data in the undersampled MR signal data set by using the value of the second MR parameter,
 extracting a second MR signal data set that matches the interpolated MR signal data set from among the stored MR signal data sets;
 obtaining a second value of the second MR parameter for the interpolated MR signal data set based on the extracted second MR signal data set; and
 interpolating unsampled MR signal data in the interpolated MR signal data set by using the second value of the second MR parameter.

7. The method of claim 6, further comprising generating an MR image by using the interpolated MR signal data set.

8. The method of claim 6, wherein the first MR parameter comprises at least one selected from Echo Time (TE), Repetition Time (TR), Inversion Time (TI), and Flip Angle (FA), and
 wherein the second MR parameter comprises at least one selected from M0, T1, T2, and ΔB.

9. The method of claim 6, wherein a map of the second MR parameter is created by using the interpolated MR signal data set.

10. The method of claim 6, further comprising:
 creating a magnetic field inhomogeneity map by using the interpolated MR signal data set;

measuring a difference between adjacent data in the magnetic field inhomogeneity map to extract a region where the measured difference is greater than or equal to a preset value;

adjusting data so that the difference for the extracted region is less than the preset value; and interpolating the interpolated MR signal data set again based on the adjusted data.

11. A non-transitory computer-readable recording medium having recorded thereon a program for executing the method of claim 6 on a computer.

* * * * *